(12) United States Patent
Kawamura et al.

(10) Patent No.: US 6,495,874 B1
(45) Date of Patent: Dec. 17, 2002

(54) SEMICONDUCTOR DEVICE AND PRODUCTION PROCESS THEREOF

(75) Inventors: Akio Kawamura, Fukuyama (JP); Takahiro Tsuchida, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/443,007

(22) Filed: Nov. 18, 1999

(30) Foreign Application Priority Data

Nov. 27, 1998 (JP) .......................................... 10-337660

(51) Int. Cl.$^7$ ........................ H01L 27/108; H01L 29/76
(52) U.S. Cl. ........................ 257/301; 257/306; 257/296
(58) Field of Search ................................. 257/301, 306, 257/296

(56) References Cited

U.S. PATENT DOCUMENTS 5,663,585 A * 9/1997 Lee et al.
5,990,508 A * 11/1999 Shinohara
6,180,976 B1 * 1/2001 Roy

FOREIGN PATENT DOCUMENTS

JP 7-115171 A 5/1996

OTHER PUBLICATIONS

Patent Abstracts of Japan, Publication No. 09036313, Feb. 2, 1997.
Patent Abstracts of Japan, Publication No. 08181282, Jul. 12, 1996.

* cited by examiner

Primary Examiner—Stephen D. Meier
(74) Attorney, Agent, or Firm—Nixon & Vanderhye P.C.

(57) ABSTRACT

A semiconductor device comprises a first insulating film which is formed on a semiconductor substrate and has a groove whose bottom does not reach said semiconductor substrate, and a capacitive element which is composed of a lower electrode of a first metal layer which is embedded in said groove, a capacitive insulating film of a second insulating film formed on said lower electrode, and an upper electrode of a second metal layer formed in a region where both said lower electrode and said capacitive insulating film are formed.

9 Claims, 6 Drawing Sheets

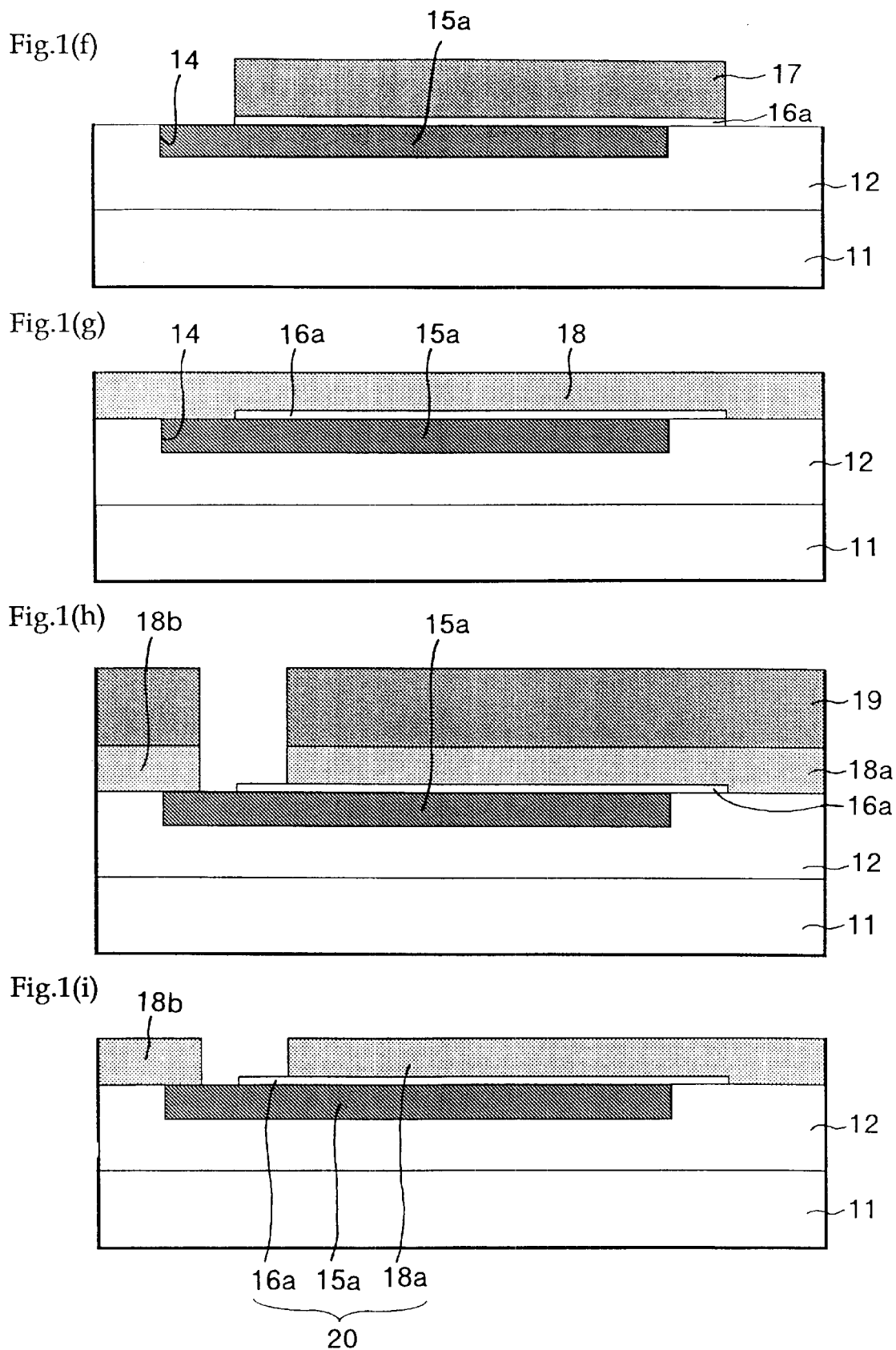

SEMICONDUCTOR DEVICE AND PRODUCTION PROCESS THEREOF

BACKGROUND OF THE INVENTION

1. Field of the Invention

The present invention relates to a semiconductor device and a process for production thereof. More particularly, the present invention is intended to provide a semiconductor device containing a precision capacitive element and a process for production thereof.

2. Description of the Related Arts

Electronic machines and equipment are becoming smaller in size and lighter in weight, and are improving in performance and expanding in functions. This movement is accelerating the trend toward integrating linear or analog circuits (essential for AV machines and communication instruments) with digital circuits into a single semiconductor device (LSI). These circuits need precision capacitive elements, which are conventionally of DFC (Double Poly Capacitor) type or MIM (Metal-Insulator-Metal) type. The former type is composed of two polysilicon layers and one capacitive insulating film held between them. The latter type is composed of two metal layers and one capacitive insulating film held between them.

A capacitive element of DPC type is disclosed in Japanese Patent Laid-open No. HEI 9(1997)-36313. It has capacitive electrodes constructed of polysilicon layers which are semiconductor layers. Therefore, a small depletion layer occurs in the capacitive electrode itself no matter how large the amount of impurities added to polysilicon may be. The depletion layer thus formed fluctuates in width depending on the potential applied across the capacitive electrodes. This leads to fluctuation in capacitive value. Therefore, the capacitive element of DPC type does not suit circuits which need a very high precision.

In contrast, the capacitive element of MIM type, in which the capacitive electrodes are made of metal, does not permit a depletion layer to occur. Therefore, it offers the advantage of keeping a constant capacitive value regardless of potential across the electrodes. For this reason, it is common practice to use capacitive elements of MIM type for precision analog circuits.

A capacitive element of MIM type and a process for production thereof are disclosed in, for example, Japanese Patent Laid-open No. HEI 8(1996)-181282.

The process is illustrated in FIGS. 3(a) to 3(d).

On a semiconductor substrate 41 is deposited a silicon oxide film 42. On the silicon oxide film 42 is deposited a first metal layer 43. From this metal layer 43 are formed a lower electrode 43a and a wiring 43b by patterning through a mask of resist pattern (not shown) formed by photolithography. See FIG. 3(a).

On the semiconductor substrate 41 is deposited an oxide film 44 by a plasma CVD method. On the oxide film 44 is formed an SOG (Spin On Glass) film 45 by spin coating. The SOG film 45 undergoes etch-back by RIE (reactive ion etching) to such an extent that the underlying oxide film 44 is exposed. As a result, the SOG film 45 partly remains on the vertical step of the first metal layer 43, thereby moderating the slope angle of the step. Furthermore, an oxide film 46 is formed on the semiconductor substrate 41 by a plasma CVD method. See FIG. 3(b).

A resist pattern (not shown) having an opening above the lower electrode 43a is formed by photolithography. Using this resist pattern as a mask, etching by RIE is performed on the oxide film 44 and 46 so as to form an opening 47 through which the surface of the lower electrode 43a is exposed. On the semiconductor substrate 41 is deposited a plasma nitride film 48 which functions as the capacitive insulating film. See FIG. 3(c).

A resist pattern (not shown) having an opening above the wiring 43b is formed by photolithography. Using this resist pattern as a mask, etching by RIE is performed on the oxide film 44 and 46 and the plasma nitride film so as to form an opening 49 through which the surface of the wiring 43b is exposed. See FIG. 3(d).

On the semiconductor substrate 41 is further deposited a second metal layer, which is subsequently undergoes patterning using a resist pattern (not shown) as a mask formed by photolithography, so that an upper electrode 50a is formed above the lower electrode 43a and a wiring 50b is formed above the wiring 43b. In this way there are obtained a capacitive element 52 of MIM structure and a wiring 51 of laminate structure, the former being composed of the lower electrode 43a, the capacitive insulating film 46 and the upper electrode 50a, and the latter being composed of the wiring 43b and the wiring 50b. See FIG. 3(d).

In addition, Japanese Patent Laid-open No. HEI 9(1997)-92786 discloses a capacitive element of MIM type and a process for production thereof, as explained in the following.

The process is illustrated in FIGS. 4(a) to 4(f).

On a semiconductor substrate 60 is deposited a first metal layer 61, which is subsequently patterned as desired. Then, on the semiconductor substrate 60 is deposited an insulating layer 62, the surface of which is subsequently planarized by CMP (Chemical Mechanical Polish) method or the like. See FIG. 4(a).

The insulating layer 62 is etched using a resist pattern (not shown) as a mask formed by photolithography to such an extent that the first metal layer 51 is exposed, so that openings 63a and 63b are formed. See FIG. 4(b).

On the semiconductor substrate 60 is entirely deposited a thin dielectric film 64, which functions as a capacitive insulating film afterward. On the thin dielectric film 64 is deposited by photolithography a resist pattern 65 which has an opening above the opening 63b. This opening functions as a connection for the metal wiring layer. See FIG. 4(c).

The dielectric film 64 undergoes etching through the resist pattern 65 as a mask, so that the first metal layer 61 is exposed at the bottom of the opening 63b. See FIG. 4(d).

On the entire surface of the semiconductor substrate 60 is deposited a second metal layer 65. See FIG. 4(e).

The second metal layer 65 is patterned into a desired form through a resist pattern (not shown) as a mask formed by photolithography, so as to form an upper electrode 65a and a wiring 65b. In this way there is formed a capacitive element 66 of MIM structure composed of the lower electrode 61, the dielectric film 64 and the upper electrode 65a, and also there is formed the wiring 65b connected to the lower electrode 61. See FIG. 4(f).

The conventional capacitive elements of MIM structure as mentioned above, however, have posed the following problems as recent semiconductor devices are required to have finer fabrication and faster operating speeds. That is, as semiconductor devices have came to have finer fabrication and faster operating speeds, the metal wiring has become multi4ayered. And in the circuits containing analog elements such as capacitive elements, three to six layers of wiring is now required.

The process of forming multi-layered wiring requires that each layer is planarized sufficiently. The result of failure in planarization is that the subsequent step to finely pattern the metal layer or to form a small opening in the interlayer film has to be carried out on an uneven surface. Photolithography on an uneven surface suffers a decrease in focusing margin, which makes it difficult to form fine and precision patterns and openings. Making each layer flat is a key factor in the process of forming multilayered wiring. One way to meet this requirement is to planarize the insulating film between metal wiring layers by CMP method.

The disadvantage of the above-mentioned conventional process for producing capacitive elements is that the opening 47 or 63a (for a capacitive element to be formed therein) causes the surface of the upper electrode 50a or 65a to have unevenness which is originated in the steps of the underlying interlayer insulating film. Such steps present difficulties in the fine patterning of the upper electrode 50a or 65a and also in the pattering of multilayered wiring formed on the electrodes.

SUMMARY OF THE INVENTION

The present invention was completed in order to address the above-mentioned problems. Accordingly, it is an object of the present invention to provide a semiconductor device having a precision capacitive element (with a structure suitable for microfabrication) and a process for producing the same.

In according with one aspect of the present invention, there is provided a semiconductor device comprises a first insulating film which is formed on a semiconductor substrate and has a groove whose bottom does not reach said semiconductor substrate, and a capacitive element which is composed of a lower electrode of a first metal layer which is embedded in said groove, a capacitive insulating film of a second insulating film formed on said lower electrode, and an upper electrode of a second metal layer formed in a region where both said lower electrode and said capacitive insulating film are formed.

In according with another aspect of the present invention, there is provided a semiconductor device comprises; an element formed on a semiconductor substrate, a first insulating film formed on the semiconductor substrate containing said element, and having at least one opening whose bottom reaches said element and at least one groove whose bottom does not reach said element, a contact plug of a first metal layer embedded in said opening, a lower electrode or wiring layer of the first metal layer embedded in the groove, a capacitive insulating film of a second insulating film formed on said lower electrode, an upper electrode of the second metal layer which is formed in a region where both the lower electrode and the capacitive insulating film are formed, and a metal wiring of the second metal layer formed on said contact plug.

In according with still another aspect of the present invention, there is provided a process for producing a semiconductor device, said process comprises the steps of: depositing a first insulating film on a semiconductor substrate, forming in said first insulating film a groove whose bottom does not reach said semiconductor substrate, depositing a first metal layer on the first insulating film containing said groove, selectively etching said first metal layer to form a lower electrode only in said groove, depositing a second insulating film on said first insulating film containing said lower electrode, patterning said second insulating film to form a capacitive insulating film on said lower electrode, depositing a second metal layer on said capacitive insulating film, and selectively etching said second metal layer to form an upper electrode in a region where both the lower electrode and the capacitive insulating film are formed.

In according with still another aspect of the present invention, there is provided a process for producing a semiconductor device, said process comprises a step of: forming an element on a semiconductor substrate, depositing a first insulating film on said element, forming in said first insulating film at least one opening whose bottom reaches said element and at least one groove whose bottom does not reach said element, depositing a first metal layer on the first insulating film containing said opening and said groove, selectively etching said first metal layer to form a contact plug in said opening and a lower electrode or wiring layer in said groove, depositing a second insulating film on the first insulating film containing said contact plug, lower electrode and wiring layer, patterning said second insulating film to form a capacitive insulating film on said lower electrode, depositing a second metal layer on said capacitive insulating layer, and selectively etching said second metal layer to form an upper electrode in a region where both the lower electrode and the capacitive insulating film are formed, and to form a metal wiring on said contact layer.

BRIEF DESCRIPTION OF THE DRAWINGS

FIGS. 1(a) to 1(i) are schematic sectional views showing one process for producing a semiconductor device according to the present invention.

DESCRIPTION OF THE PREFERRED EMBODIMENTS

Figure 1A:
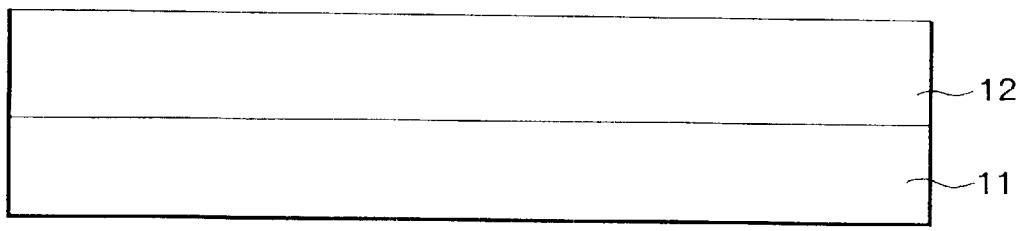

The semiconductor device of the present invention is comprised mainly a semiconductor substrate, a first insulating film, and a capacitive element formed thereon which consists of a lower electrode, a capacitive insulating film and an upper electrode.

The semiconductor substrate used in the present invention is not specifically restricted; it may be any substrate that is commonly used for semiconductor devices. It may be one which is made of a semiconductor (such as silicon and germanium) or a compound semiconductor (such as GaAs and InGaAs). A silicon substrate is desirable. This substrate may have a device isolating film (for LOCOS isolation or trench isolation). Further, this substrate may have elements (such as transistors, capacitors and resistors), wirings and insulating films formed thereon individually or in combination with one another.

The semiconductor substrate has a first insulating film formed thereon. This first insulating film has at least one groove whose bottom does not reach the semiconductor substrate. This first insulating film is not specifically restricted in its material so long as it has insulating properties. It is exemplified by silicon oxide film, silicon nitride film, PSG film and BPSG film, in single layer or multiple layers. These insulating films may be formed by any known method. The thickness of the first insulating film is not specifically restricted so long as it is large enough for the insulating film to function as a normal interlayer insulating film. For example, it is in the range of about 700 to about 1000 nm.

The first insulating film has in its surface one or more grooves whose bottom does not reach the semiconductor substrate. The depth of the groove is smaller than the thickness of the first insulating film; it is preferably equal to the thickness of the lower electrode and wiring layer of the capacitive element (mentioned later). To be specific, the depth of the groove may be about 100 to about 1400 nm if the thickness of the first insulating film is about 700 to about 1000 nm. The shape of the groove is not specifically restricted; however, it preferably conform to the lower electrode and wiring layer of the capacitive element (mentioned later).

In the case where the first insulating film is formed on the semiconductor substrate containing elements, it has at least one opening whose bottom reaches the element. In other words, if the element is a transistor, the bottom of the opening reaches the surface of the gate electrode of the transistor or the surface of the source/drain regions of the transistor (the surface of the semiconductor substrate). If the element is a capacitive element, resistor or wiring, the bottom of the opening reaches the surface of their electrode. Also, the opening may be formed in the above-mentioned groove. In this case, the depth of the opening is equal to the distance from the bottom of the groove to the element. The size of the opening is not specifically restricted so long as it is large enough to secure connection between the upper conducting layer and the lower conducting layer. The diameter may be in the range of about 0.15 to about 0.6 $\mu$m.

A lower electrode of a first metal layer is embedded in the groove formed in the first insulating film. The first metal layer may be formed from any material, which is not specifically restricted so long as it is a conducting material commonly used for electrodes. The first metal layer may be formed from, for example, a signal layer mainly made of metals such as. Al, Cu and Pt, or metals with high melting points such as W, Ta and Ti, a single layer of metal compounds (alloy, silicide, etc.) of these metals, or multiple layers containing these metals or metal compounds. The lower electrode constructed of the first metal layer may be embedded entirely or partly in the groove formed in the first insulating film. It is preferably embedded completely such that the surface of the lower electrode is flush with the surface of the first insulating film. In the case where the lower electrode is embedded in the groove of the first insulating film, the surface of the semiconductor substrate is completely planarized even after the lower electrode has been formed, which facilitates the subsequent photolithography and etching process. The thickness of the lower electrode is determined by the depth of the groove formed in the first insulating film. It may be about 100 to about 400 nm. The first metal layer may form not only the lower electrode but also the wiring layer (which is embedded in the groove of the first insulating layer as in the case of the lower electrode) in the region outside the region in which the capacitive element is formed. In the case where the first metal layer is embedded in the opening, it may form a contact plug.

On the lower electrode is formed a capacitive insulating film of a second insulating film. The second insulating film may be formed from any material which can be used as a dielectric for ordinary capacitive elements. It may be, for example, silicon oxide film, silicon nitride film, tantalum oxide film or titanium oxide film, in the form of single layer or multiple layers. It may also be a ferroelectric film of PZT or SBT, in the form of single layer or multiple layers. These insulating films may be formed by any known method. The thickness of the second insulating film is not specifically restricted so long as it is large enough for the insulating film to function as a dielectric for the capacitive element. For example, the thickness is about 10 to about 100 nm (in terms of oxide film). The capacitive insulating film may be formed above a portion of the lower electrode or may be formed such that it extends to the first insulating film which exists in the vicinity of the lower electrode or it extends above the first metal layer which does not function as the lower electrode, so long as it is formed above the lower electrode.

The upper electrode of a second metal layer is formed above the region in which both the lower electrode and the capacitive insulating film are formed. The second metal layer may be formed from a conducting material as in the case of the first metal layer. But it is not always necessary to use the same conducting material as used for the first metal layer. The upper electrode constructed of the second metal layer may be extended above the first insulating film which exists in the vicinity of the lower electrode or extended above the capacitive insulating film under which the lower electrode is not arranged or extended above the first metal layer which does not function as the lower electrode and is not connected directly to the lower electrode, so long as it is formed above the region in which both the lower electrode and the capacitive insulating film are formed. The thickness of the upper electrode may be in the range of about 300 to about 600 nm. The second metal layer may form not only the upper electrode but also the metal wiring (for example, the metal wiring on the contact plug) in the region outside the region in which the capacitive element is formed.

According to the present invention, the capacitive element (which is made up of the above-mentioned lower electrode, capacitive insulating film and upper electrode) is formed on the semiconductor substrate on which is formed the first insulating film. The advantage of this structure is that the surface of the substrate can be readily planarized after the lower electrode has been formed. Thus it is possible to eliminate difficulties in the subsequent steps due to uneven surface.

In the process for producing a semiconductor device according to the present invention, deposition of the first insulating film on the semiconductor substrate may be accomplished in any known method (such as a CVD method and sputtering), which is selected according to the material of the insulating film. In the case where elements are formed on the semiconductor substrate before deposition of the first insulating film, it is possible to form transistors, wiring, capacitors, resistors and insulating film by any known method.

Forming a groove in the first insulating film may be accomplished by any known method, which comprises etching through a resist mask formed into a desired shape by photolithography. This method may also be applied to making an opening in the first insulating film.

Deposition of the first insulating film (containing the groove) on the first metal layer may be accomplished by any known method, such as a CVD method and sputtering, which is selected according to the material of the first metal layer. The first metal layer is preferably deposited thicker than the depth of the groove formed earlier. In this way it is possible to form the lower electrode whose surface is flush with the first insulating film. Incidentally, in the case where both groove and the opening are formed in the first insulating film, it is desirable that the first metal layer be deposited thicker than the depth of the groove formed in the first insulating film and thicker than half the width of the opening. This permits secure connection between the conductive material of the upper layer and the conducting layer of the lower layer without the contact plug (formed in the opening) being broken.

The lower electrode is formed only inside the groove by selective etching of the first metal layer. This selective etching may be accomplished by a conventional method, such as dry etching and a CMP method. This etching removes the first metal layer present on the surface of the first insulating film, while leaving the first metal layer only inside the groove (or the recess). Incidentally, in the case where an opening is formed in the first insulating film, the contact plug is formed only inside the opening in substantially the same way as the lower electrode is formed only in the groove. The wiring layer may also be formed in the same way.

Deposition of the second insulating film on the first insulating film containing the lower electrode may be accomplished in any known method, such as a CVD method and sputtering, according to the material of the second insulating film.

The capacitive insulating film is formed on the lower electrode by patterning the second insulating film. This patterning may be accomplished by any known method, such as photolithography (to form a resist mask of a desired shape) and etching (using this resist mask) process.

Deposition of the second metal layer on the capacitive insulating film may be accomplished by the same way as for deposition of the first metal layer.

The upper electrode is formed by selective etching of the second metal layer. This etching may be accomplished by substantially the same way as used for patterning the second insulating film.

In the production of the semiconductor device according to the present invention, it is not always necessary to carry out the steps in the above-mentioned sequence. For example, in the case where both the groove and the opening are to be formed in the first insulating film, it is possible to form the opening after the groove has been formed or it is possible to form the groove after the opening has been formed. Also, in the case where the capacitive element is to be formed, the following sequence is permissible. The first metal layer undergoes etching to form the lower electrode. The second insulating film is deposited. The second metal layer is deposited. The second insulating film layer and the second metal layer are patterned simultaneously to form the capacitive insulating film and the upper electrode. Alternatively, the lower electrode is formed. Then, the second insulating film is deposited. The second insulating film is patterned to form the capacitive insulating film. The second metal layer is deposited. The second metal layer is patterned, thereby the upper electrode is formed.

The semiconductor device and its manufacturing process according to the present invention are described below with reference to the accompanying drawings.

Embodiment 1

On a silicon substrate 11 are formed elements such as MOS transistor and/or diode (not shown) by the ordinary process. Then, an insulating film 12 (about 700 to about 1000 nm thick) of $SiO_2$, PSG or BPSG (in the form of single layer or multiple layers) is deposited by a CVD method. The insulating film 12 has its surface planarized by CMP (Chemical Mechanical Polish) method, as shown in FIG. 1(a).

Figure 1B:
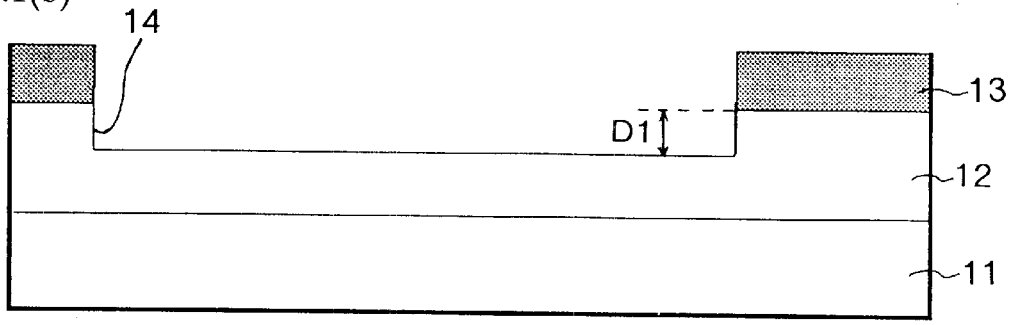

A resist pattern 13 (which has an opening in the region where the lower electrode for the capacitive element is formed) is formed by photolithography. Using this resist pattern 13 as a mask, a groove 14, whose depth D1 is about 300 nm, is formed in the surface of the insulating film 12, as shown in FIG. 1(b).

Figure 1C:
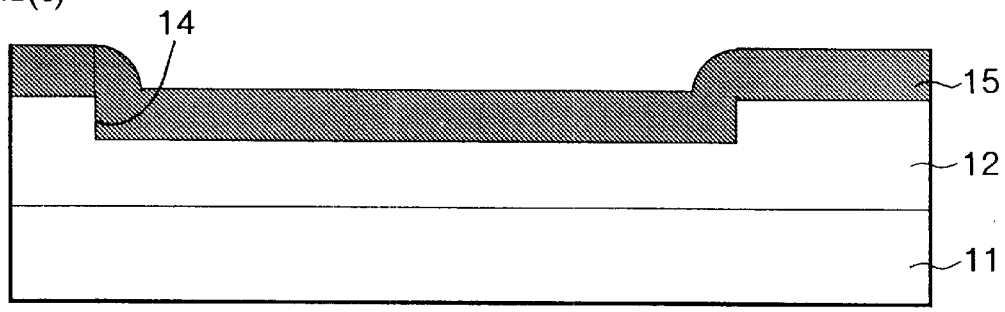

With the resist pattern 13 removed, a tungsten film 15 is deposited by sputtering on the entire surface of the insulating film 12 containing the groove 14, as shown in FIG. 1(c). The tungsten film 15 preferably have a thickness greater than D1 so that the groove 14 is completely embedded. The thickness is about 400 nm in this embodiment.

Figure 1D:
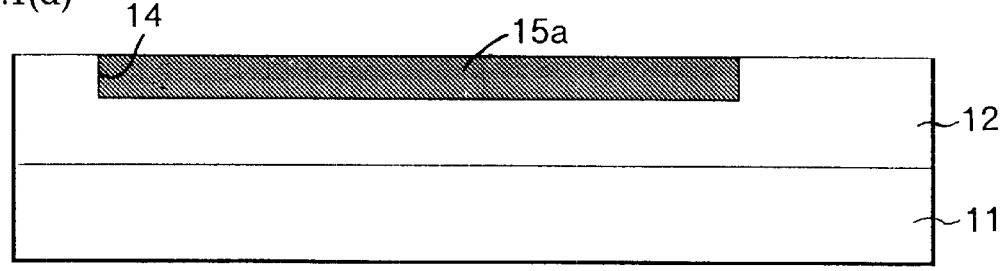

The tungsten film 15 is polished by CMP method to such an extent that the surface of the insulating film 12 is exposed. Thus, a lower electrode 15a is formed only in the groove 14, as shown in FIG. 1(d). This lower electrode 15a has a flat surface which is flush with the surface of the insulating film 12.

Figure 1E:
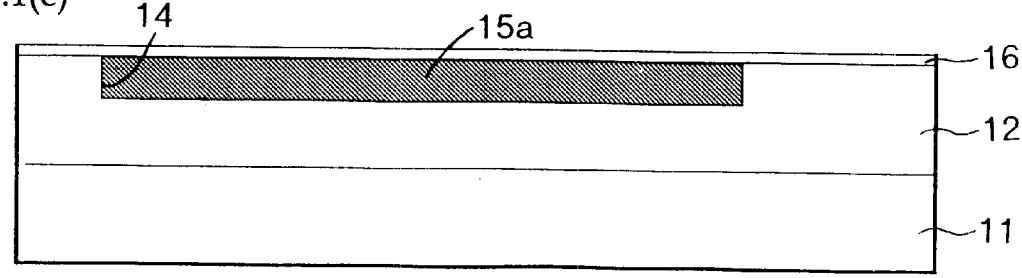

On the resulting silicon substrate 11 is formed by a CVD method an insulating film 16 composed of a silicon oxide film (about 20 nm) and a silicon nitride film (about 20 nm), as shown in FIG. 1(e).

A resist pattern 17 is formed by photolithography. Using this resist pattern as a mask, the insulating film 16 is patterned so as to form a capacitive insulating film 16a, as shown in FIG. 1(f).

The resist pattern 17 is removed, and an AlCu film 18 (400 nm) is deposited on the entire surface of the resulting silicon substrate 11, as shown in FIG. 1(g).

A resist pattern 19 is formed by photolithography. Using this resist pattern as a mask, the AlCu film 18 is patterned so as to form an upper electrode 18a and the metal wiring 18b, as shown in FIG. 1(h). Incidentally, the patterning of the AlCu film 18 is carried out on the extremely smooth surface of the silicon substrate 11. This facilitates the photolithography and etching processe.

The resist pattern 19 is removed, as shown in FIG. 1(i). Wiring and protective film (not shown) are formed by the ordinary methods. Thus a semiconductor device is formed which has a capacitive element 20 of MIM type consisting of the lower electrode 15a, the capacitive insulating film 16a and the upper electrode 18a.

The above-mentioned semiconductor device is constructed such that the lower electrode 15a of the capacitive element 20 is connected to the metal wiring 18b, so that signals are exchanged with the lower electrode through this metal wiring 18b.

The metal wiring 18b is formed, in the region other than the region where the capacitive element 20 is formed, as wiring of other circuits of the semiconductor device, although this is not shown in FIGS. 1(a) to 1(i).

Embodiment 2

Figure 2A:
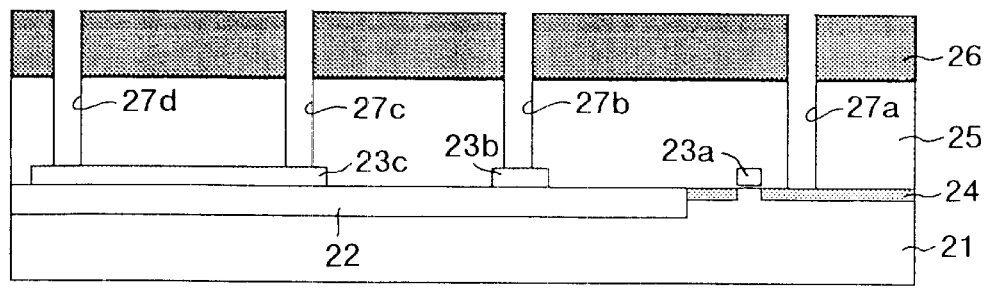
FIGS. 2(a) to 2(g) are schematic sectional views showing another process for producing a semiconductor device according to the present invention.
Figure 2B:
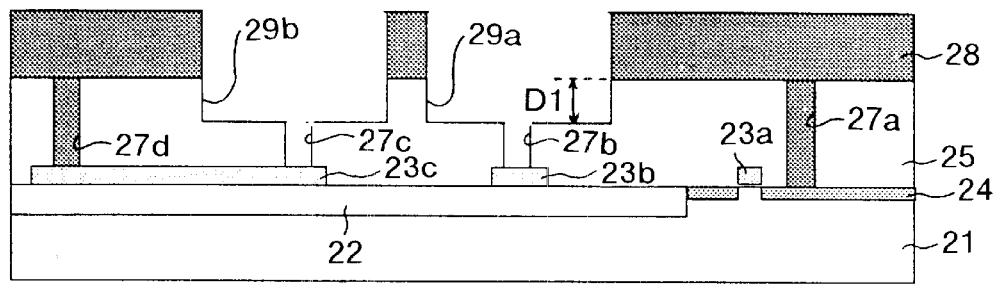
Figure 2C:
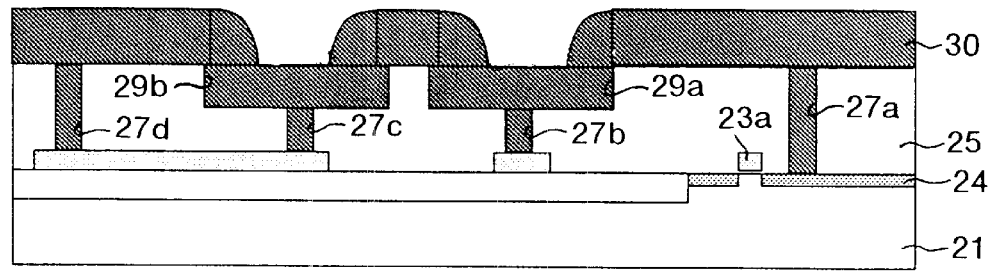
Figure 2D:
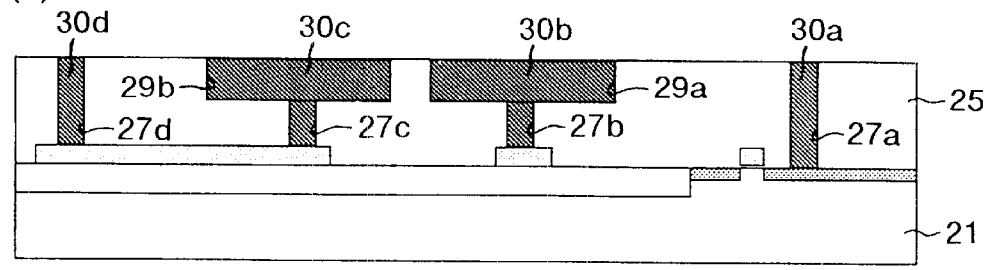
Figure 2E:
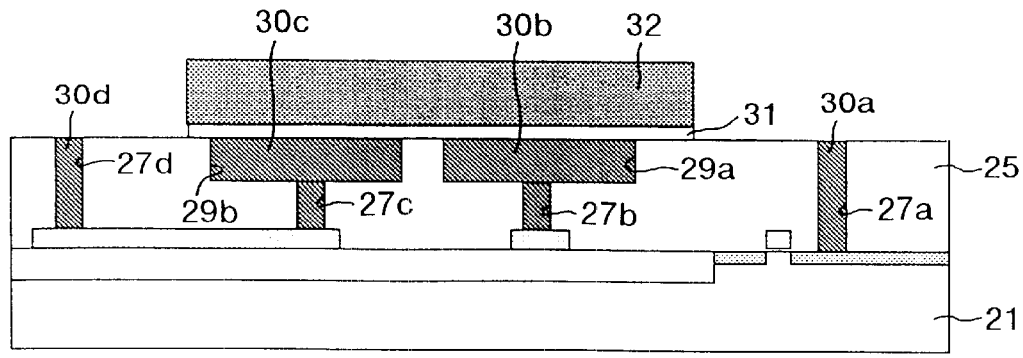
Figure 2F:
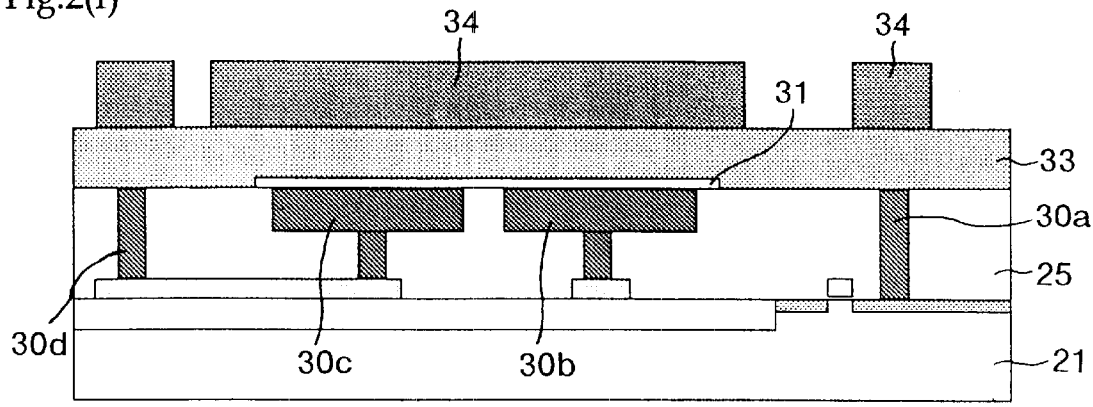
Figure 2G:
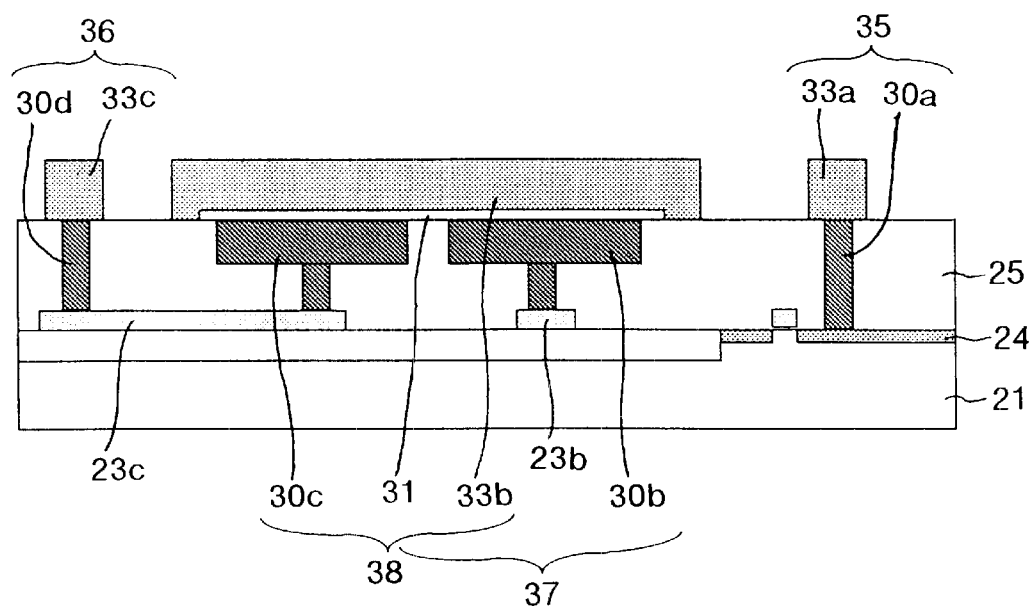
Figure 3A:
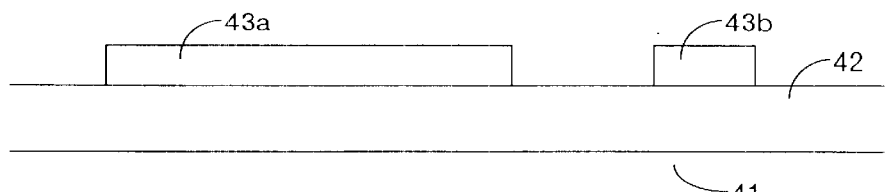
FIGS. 3(a) to 3(d) are schematic sectional views showing the process for producing a conventional semiconductor device containing a capacitive element of MIM type.
Figure 3B:
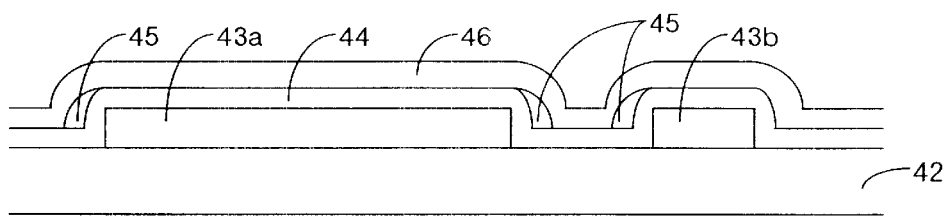
Figure 3C:
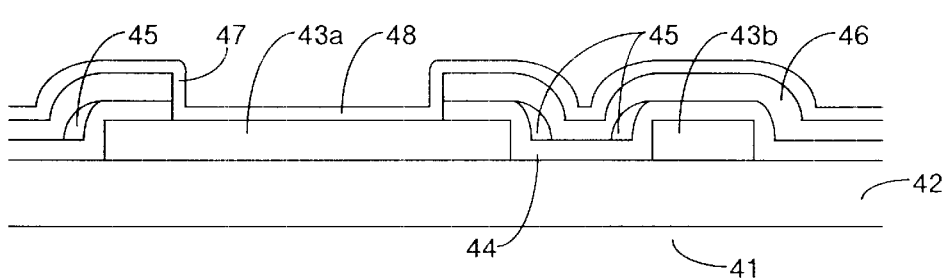
Figure 3D:
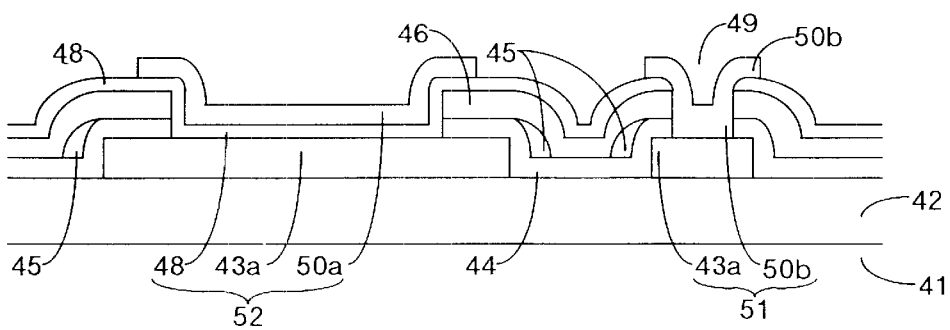
Figure 4A:
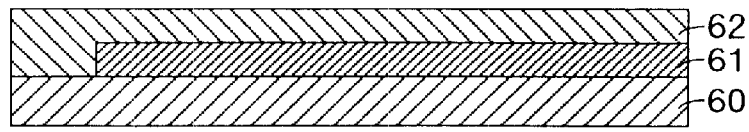
FIGS. 4(a) to 4(f) are schematic sectional views showing the process for producing another conventional semiconductor device containing a capacitive element of MIM type.
Figure 4B:
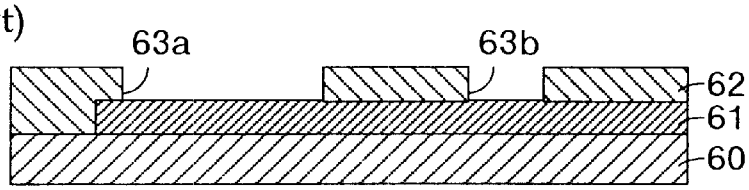
Figure 4C:
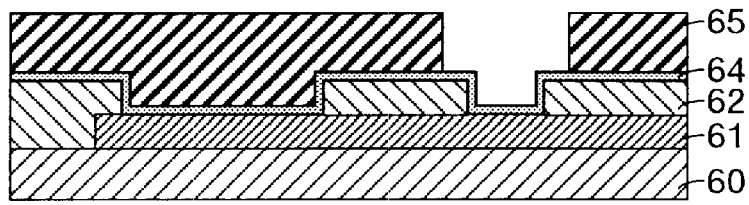
Figure 4D:
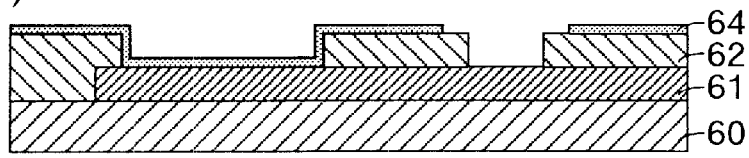
Figure 4E:
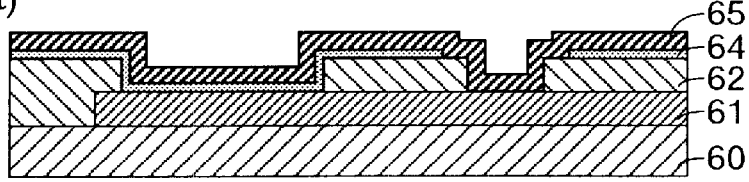
Figure 4F:
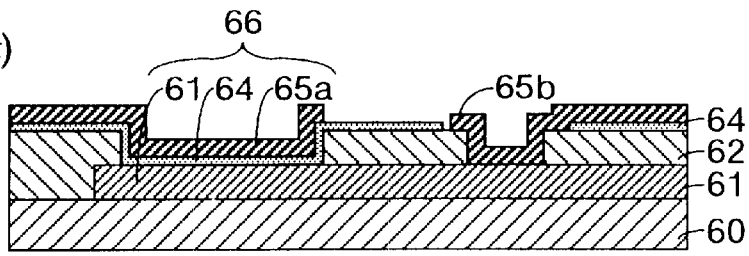

On a silicon substrate 21 are formed by the ordinary process a device isolating film 22 ($SiO_2$ film), an MOS transistor composed of a gate electrode 23a (polysilicon film) and a source/drain region 24, and wirings 23b and 23c of polysilicon film. Then, an insulating film 25 (about 700 to about 1000 nm thick) of $SiO_2$, PSG, BPSG or the like (in the form of single layer or multiple layers) is deposited. The insulating film 25 has its surface planarized by CMP method. A resist pattern 26 is formed by photolithography. Using this resist pattern 26 as a mask, openings 27a to 27d are formed in the insulating film 25, as shown in FIG. 2(a).

These openings are about 0.3 μm wide and reach the source/drain region 24 or the wirings 23*b* and 23*c*.

The resist pattern 26 is removed, and a new resist pattern 28 is formed by photolithography which has an opening in the region where the lower electrode of the capacitive element is formed later. Using this resist pattern 28 as a mask, the surface of the insulating film 25 is dug and grooves 29*a* and 29*b* (which have a depth D1 of about 300 nm) are formed above the openings 27*b* and 27*c*, as shown in FIG. 2(*b*).

The resist pattern 28 is removed, and a tungsten film 30 is deposited by sputtering on the surface of the insulating film 25 so as to embed the grooves 29*a* and 29*b* and the openings 27*a* to 27*d*, as shown in FIG. 2(*c*). The tungsten film 30 preferably have a thickness greater than D1 so that the grooves 29*a* and 29*b* are completely embedded and also greater than one half the width of the opening so that the openings 27*a* to 27*d* are completely embedded. The thickness is about 400 nm in this embodiment.

The tungsten film 30 is polished by CMP method to such an extent that the surface of the insulating film 25 is exposed. Thus, contact plugs 30*a* and 30*d* are formed in the openings 27*a* and 27*d*. These contact plugs have a flat surface which is flush with the surface of the insulating film 25. At the same time, lower electrodes 30*b* and 30*c* are formed in the openings 27*b* and 27*c* and in the grooves 29*a* and 29*b*. These lower electrodes are connected to the contact plug and have a flat surface which is flush with the surface of the insulating film 25, as shown in FIG. 2(*d*).

On the resulting silicon substrate 21 is formed by a CVD method an insulating film composed of a silicon oxide film (about 20 mn) and a silicon nitride film (about 20 nm). A resist pattern 32 is then formed by photolithography. Using this resist pattern as a mask, the insulating film is patterned so as to form a common capacitive insulating film 31. As a result, the surface of the contact plugs 30*a* and 30*d* in the openings 27*a* and 27*d* are exposed and the surface of the lower electrode 30*b* and 30*c* in the grooves 29*a* and 29*b* are covered by the common capacitive insulating film 31, as shown in FIG. 2(*e*). The resist pattern 32 is removed, and an AlCu film 33 (about 400 nm) is deposited on the entire surface of the resulting silicon substrate 21. A resist pattern 34 is formed on the AlCu film 33 by photolithography, as shown in FIG. 2(*f*).

Using this resist pattern 34 as a mask, the AlCu film 33 is patterned so as to form a common upper electrode 33*b* and metal wirings 33*a* and 33*c*, as shown in FIG. 2(*g*). Incidentally, the patterning of the AlCu film 33 is carried out on the extremely smooth surface of the silicon substrate 21. This facilitates the photolithography and etching steps.

Then the resist pattern 34 is removed. Wiring and protective film are formed by the ordinary steps. Thus a semiconductor device is formed which is made up of the following elements:

the capacitive element 37 of MIM type consisting of the lower electrode 30*b* (connected to the wiring 23*b*), the common capacitive insulating film 31 and the common upper electrode 33*b*, the capacitive element 38 of MIM type consisting of the lower electrode 30*c* (connected to the wiring 23*c*), the common capacitive insulating film 31 and the common upper electrode 33*b*, the wiring 35 of dual layer structure consisting of the contact plug 30*a* (connected to the source/drain region 24) and the metal wiring 33*a*, the wiring 36 of dual layer structure consisting of the contact plug 30*d* (connected to the wiring 23*c*) and the metal wiring 33*c*.

As a result, the capacitive element 38 of MIM type is constructed such that signals are exchanged with the control circuit through the lower electrode 30*c*, the wiring 23*c*, the contact plug 30*d*, and the metal wiring 33*c*.

The metal wiring 33*c* is formed, in the region other than the region where the capacitive elements 37 and 38 are formed, as the wiring for other circuits of the semiconductor device, although this is not shown in FIGS. 2(*a*) to 2(*g*).

The semiconductor device in the second embodiment is constructed such that signals are exchanged between the capacitive element 38 and the control circuit though the wiring and contact plug. But it may be constructed such that the lower electrode 30*c* of the capacitive element 38 is extended and connected directly to the metal wiring 33*c*, as in the first embodiment.

The semiconductor device of the present invention is constructed such that the lower electrode is embedded in the groove of the first insulating film. Therefore, the surface of the lower electrode is almost flush with the surface of the first insulating film. This structure permits easy and accurate microfabrication for the capacitive insulating film and upper electrode to be formed later. In addition, the fact that the capacitive insulating film is held between the flat electrode surfaces eliminates the concentration of electric field and leads to reliable capacitive elements. Therefore, the present invention facilitates the production of reliable semiconductor devices.

Also, the semiconductor device of the present invention is constructed such that the metal layer constituting the upper and lower electrodes functions as the wiring layer constituting the semiconductor circuit in the region other than the region where the capacitive element is formed. Therefore, it has the multilayer wiring structure without the necessity of adding a separate step for making the wiring layer. This saves production cost and permits production of inexpensive semiconductor devices.

What is claimed is:

1. A semiconductor device comprising a first insulating film which is formed on a semiconductor substrate and has a groove whose bottom does not reach said semiconductor substrate, and a capacitive element comprising:

a lower electrode of a first metal layer which is embedded in said groove so that an upper surface of said lower electrode is substantially flush with an upper surface of said first insulating film in which the groove is formed, a capacitive insulating film of a second insulating film formed on said lower electrode, and an upper electrode of a second metal layer formed in a region where both said lower electrode and said capacitive insulating film are formed.

2. The semiconductor device as defined in claim 1 wherein the second metal layer also constitutes a metal wiring.

3. The device of claim 2, wherein the first metal layer also constitutes a metal wiring.

4. The device of claim 1, wherein the first metal layer also constitutes a metal wiring.

5. A semiconductor device comprising;

an element formed on a semiconductor substrate, a first insulating film formed on the semiconductor substrate containing said element, and having at least one opening whose bottom reaches said element and at least one groove whose bottom does not reach said element, a contact plug of a first metal layer embedded in said opening, a lower electrode or wiring layer of the first metal layer embedded in the groove so that an upper surface of the lower electrode is substantially flush with an upper surface of the first insulating film in which the groove is formed, a capacitive insulating film of a second insulating film formed on said lower electrode, an upper electrode of a second metal layer which is at least partially formed in a region where both the lower electrode and the capacitive insulating film are formed, and a metal wiring of the second metal layer formed on said contact plug.

6. The device of claim 3, wherein the first metal layer also constitutes a metal wiring.

7. The device of claim 3, wherein the element formed on the semiconductor substrate comprises at least one of a conductive wiring, a source region, and a drain region.

8. A semiconductor device comprising a first insulating film which is formed on a semiconductor substrate and has a groove whose bottom does not reach said semiconductor substrate, and a capacitive element comprising:

a lower electrode of a first metal layer which is embedded in said groove, a capacitive insulating film of a second insulating film formed on said lower electrode, wherein an upper surface of the capacitive insulating film is located above an upper surface of the first insulating film, and an upper electrode of a second metal layer at least partially formed in a region where both said lower electrode and said capacitive insulating film are formed.

9. A semiconductor device comprising a first insulating film which is formed on a semiconductor substrate and has a groove defined therein, and a capacitive element comprising:

a lower electrode of a first metal layer which is embedded in said groove, a capacitive insulating film of a second insulating film formed on said lower electrode, an upper electrode of a second metal layer at least partially formed in a region where both said lower electrode and said capacitive insulating film are formed, and wherein an upper surface of the upper electrode is located above an upper surface of the first insulating film.

* * * * *